United States Patent
Carper et al.

(10) Patent No.: US 12,119,855 B2
(45) Date of Patent: Oct. 15, 2024

(54) SINGLE-CABLE RADIO ANTENNA SYSTEM FOR A VEHICLE

(71) Applicant: GM Global Technology Operations LLC, Detroit, MI (US)

(72) Inventors: Duane S. Carper, Davison, MI (US); Nahel Eshaq, Rochester, MI (US); Gregg R. Kittinger, Oakland Township, MI (US); Hyok Jae Song, Oak Park, CA (US); Hanseung Lee, Thousand Oaks, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 353 days.

(21) Appl. No.: 17/812,012

(22) Filed: Jul. 12, 2022

(65) Prior Publication Data

US 2024/0022274 A1    Jan. 18, 2024

(51) Int. Cl.
| | | |
|---|---|---|
| H04B 1/16 | (2006.01) | |
| H03F 3/19 | (2006.01) | |
| H04B 1/00 | (2006.01) | |

(52) U.S. Cl.
CPC ............ *H04B 1/16* (2013.01); *H03F 3/19* (2013.01); *H04B 1/0064* (2013.01); *H03F 2200/451* (2013.01)

(58) Field of Classification Search
CPC ...... H04B 1/0064; H04B 1/18; H04B 1/1646; H03F 3/19; H03F 2200/451
See application file for complete search history.

(56) References Cited

U.S. PATENT DOCUMENTS

| | | | |
|---|---|---|---|
| 2002/0168955 A1* | 11/2002 | Wildhagen | H04B 7/0857 455/131 |
| 2010/0035468 A1* | 2/2010 | Perrot | H01Q 1/1207 29/428 |
| 2020/0328762 A1* | 10/2020 | Lee | H01Q 1/3275 |
| 2022/0294101 A1 | 9/2022 | Song et al. | |
| 2022/0294105 A1 | 9/2022 | Song et al. | |
| 2022/0294114 A1 | 9/2022 | Song et al. | |

* cited by examiner

*Primary Examiner* — Keith Ferguson
(74) *Attorney, Agent, or Firm* — Vivacqua Crane, PLLC (57) ABSTRACT

A system for receiving radio signals for a vehicle includes an antenna farm unit including a plurality of antennas, a plurality of amplifiers, each of the plurality of amplifiers in electrical communication with one of the plurality of antennas, and a multiplexer in electrical communication with the output port of each of the plurality of amplifiers. The system also includes a radio unit including a plurality of tuners and a demultiplexer in electrical communication with the plurality of tuners. The system also includes a transmission line for connecting the antenna farm unit to the radio unit, where the transmission line has a first terminal and a second terminal, and where the first terminal of the transmission line is electrically connected to the multiplexer and the second terminal of the transmission line is electrically connected to the demultiplexer.

20 Claims, 4 Drawing Sheets

SINGLE-CABLE RADIO ANTENNA SYSTEM FOR A VEHICLE

INTRODUCTION

The present disclosure relates to a system for receiving radio signals for a vehicle.

To provide entertainment and information to occupants of a vehicle, antennas are used to receive radio signals from the environment. The radio signals may transmit entertainment such as music, news, talk-shows, and sports programming. The radio signals may also transmit information such as traffic and weather conditions. Many different types of radio signals may be available, requiring multiple different antennas in order to receive the various radio signals. Systems have been developed for vehicles to receive radio signals from the environment, often including multiple antennas. However, systems to receive radio signals with multiple antennas often require multiple cables because each antenna must be connected to the system. Multiple cables may increase cost and/or weight of the system and thus the vehicle.

Thus, while current systems for receiving radio signals for a vehicle achieve their intended purpose, there is a need for a new and improved system for receiving radio signals for a vehicle.

SUMMARY

According to several aspects, a system for receiving radio signals for a vehicle is provided. The system includes an antenna farm unit including a plurality of antennas, a plurality of amplifiers, where each of the plurality of amplifiers has an input port and an output port, and where the input port of each of the plurality of amplifiers is in electrical communication with one of the plurality of antennas, and a multiplexer in electrical communication with the output port of each of the plurality of amplifiers. The system also includes a radio unit including a plurality of tuners and a demultiplexer in electrical communication with the plurality of tuners. The system also includes a transmission line for connecting the antenna farm unit to the radio unit, where the transmission line has a first terminal and a second terminal, and where the first terminal of the transmission line is electrically connected to the multiplexer and the second terminal of the transmission line is electrically connected to the demultiplexer.

In another aspect of the present disclosure, the plurality of antennas of the antenna farm unit includes a first antenna for receiving amplitude modulated (AM) radio signals and frequency modulated (FM) radio signals and a second antenna configured for receiving satellite radio signals. The plurality of amplifiers includes a first amplifier, where the input port of the first amplifier is connected to the first antenna and a second amplifier, where the input port of the second amplifier is connected to the second antenna. The plurality of tuners of the radio unit includes an AM/FM tuner and a satellite radio tuner.

In another aspect of the present disclosure, the multiplexer and the demultiplexer each have a first port, a second port, and a third port. At least one of the multiplexer and the demultiplexer includes a first low-pass filter having a first terminal and a second terminal, where the first terminal of the first low-pass filter is connected to the first port, a band-pass filter having a first terminal and a second terminal, where the first terminal of the band-pass filter is connected to the second port, and a second low-pass filter having a first terminal and a second terminal, where the first terminal of the second low-pass filter is connected to the third port. The second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter. The first port of the multiplexer is connected to the output port of the first amplifier, the second port of the multiplexer is connected to the output port of the second amplifier, and the third port of the multiplexer is connected to the first terminal of the transmission line. The first port of the demultiplexer is connected to the AM/FM tuner, the second port of the demultiplexer is connected to the satellite radio tuner, and the third port of the demultiplexer is connected to the second terminal of the transmission line.

In another aspect of the present disclosure, the first low-pass filter of at least one of the multiplexer and the demultiplexer includes an inductor having a first terminal and a second terminal, where the first terminal of the inductor is connected to the first terminal of the first low-pass filter and the second terminal of the inductor is connected to the second terminal of the first low-pass filter. The first low-pass filter of at least one of the multiplexer and the demultiplexer further includes a capacitor having a first terminal and a second terminal, where the first terminal of the capacitor is connected to the first terminal of the first low-pass filter and the second terminal of the capacitor is connected to a ground reference potential. The second low-pass filter of at least one of the multiplexer and the demultiplexer includes an inductor having a first terminal and a second terminal, where the first terminal of the inductor is connected to the first terminal of the second low-pass filter and the second terminal of the inductor is connected to the second terminal of the second low-pass filter. The first low-pass filter of at least one of the multiplexer and the demultiplexer further includes a capacitor having a first terminal and a second terminal, where the first terminal of the capacitor is connected to the first terminal of the second low-pass filter and the second terminal of the capacitor is connected to the ground reference potential.

In another aspect of the present disclosure, the band-pass filter of at least one of the multiplexer and the demultiplexer includes a first inductor having a first terminal and a second terminal, where the first terminal of the first inductor is connected to the first terminal of the band-pass filter and the second terminal of the first inductor is connected to the second terminal of the band-pass filter. The band-pass filter of at least one of the multiplexer and the demultiplexer further includes a first capacitor having a first terminal and a second terminal, where the first terminal of the first capacitor is connected to the first terminal of the band-pass filter and the second terminal of the first capacitor is connected to the second terminal of the band-pass filter. The band-pass filter of at least one of the multiplexer and the demultiplexer further includes a second inductor having a first terminal and a second terminal, where the second terminal of the second inductor is connected to the ground reference potential. The band-pass filter of at least one of the multiplexer and the demultiplexer further includes a second capacitor having a first terminal and a second terminal, where the first terminal of the second capacitor is connected to the first terminal of the band-pass filter and the second terminal of the second capacitor is connected to the first terminal of the second inductor.

In another aspect of the present disclosure, at least one of the first low-pass filter, the band-pass filter, and the second low-pass filter is an active filter.

In another aspect of the present disclosure, at least one of the first low-pass filter and the second low-pass filter has an upper cutoff frequency of about 108 MHz.

In another aspect of the present disclosure, the band-pass filter has a lower cutoff frequency of about 2320 MHz and an upper cutoff frequency of about 2345 MHz.

In another aspect of the present disclosure, the multiplexer is located proximate to the second amplifier and the second antenna.

In another aspect of the present disclosure, the first terminal of the transmission line is further connected to the plurality of amplifiers, and where the plurality of amplifiers each receive a power supply and a DC bias signal from the radio unit using the transmission line.

According to several aspects, a system for receiving radio signals for a vehicle is provided. The system includes an antenna farm unit including a plurality of antennas, a plurality of amplifiers, where each of the plurality of amplifiers has an input port and an output port, and where the input port of each of the plurality of amplifiers is in electrical communication with one of the plurality of antennas, and a radio frequency (RF) switch in electrical communication with the output port of each of the plurality of amplifiers. The system also includes a radio unit including a plurality of tuners and a demultiplexer in electrical communication with the plurality of tuners. The system also includes a transmission line for connecting the antenna farm unit to the radio unit, where the transmission line has a first terminal and a second terminal, and where the first terminal of the transmission line is electrically connected to the RF switch and the second terminal of the transmission line is electrically connected to the demultiplexer.

In another aspect of the present disclosure, the plurality of antennas of the antenna farm unit includes a first antenna for receiving amplitude modulated (AM) radio signals and frequency modulated (FM) radio signals and a second antenna configured for receiving satellite radio signals. The plurality of amplifiers includes a first amplifier, where the input port of the first amplifier is connected to the first antenna and the first amplifier receives power and dc bias from the radio unit using the transmission line and a second amplifier, where the input port of the second amplifier is connected to the second antenna and the second amplifier receives power and dc bias from the radio unit using the transmission line. The plurality of tuners of the radio unit includes an AM/FM tuner and a satellite radio tuner.

In another aspect of the present disclosure, the RF switch is a single pole, double throw (SPDT) RF switch having a first terminal connected to the output port of the first amplifier, a second terminal connected to the output port of the second amplifier, and a third terminal connected to the first terminal of the transmission line. The SPDT RF switch is configured to be operated by a control signal received at the third terminal of the SPDT RF switch from the transmission line.

In another aspect of the present disclosure, the demultiplexer has a first port, a second port, and a third port. The demultiplexer further includes a first low-pass filter having a first terminal and a second terminal, where the first terminal of the first low-pass filter is connected to the first port. The demultiplexer further includes a band-pass filter having a first terminal and a second terminal, where the first terminal of the band-pass filter is connected to the second port. The demultiplexer further includes a second low-pass filter having a first terminal and a second terminal, where the first terminal of the second low-pass filter is connected to the third port. The second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter. The first port of the demultiplexer is connected to the AM/FM tuner, the second port of the demultiplexer is connected to the satellite radio tuner, and the third port of the demultiplexer is connected to the second terminal of the transmission line.

In another aspect of the present disclosure, the first low-pass filter of the demultiplexer includes an inductor having a first terminal and a second terminal, where the first terminal of the inductor is connected to the first terminal of the first low-pass filter and the second terminal of the inductor is connected to the second terminal of the first low-pass filter. The first low-pass filter of the demultiplexer further includes a capacitor having a first terminal and a second terminal, where the first terminal of the capacitor is connected to the first terminal of the first low-pass filter and the second terminal of the capacitor is connected to a ground reference potential. The second low-pass filter of the demultiplexer includes an inductor having a first terminal and a second terminal, where the first terminal of the inductor is connected to the first terminal of the second low-pass filter and the second terminal of the inductor is connected to the second terminal of the second low-pass filter. The second low-pass filter of the demultiplexer further includes a capacitor having a first terminal and a second terminal, where the first terminal of the capacitor is connected to the first terminal of the second low-pass filter and the second terminal of the capacitor is connected to the ground reference potential.

In another aspect of the present disclosure, the band-pass filter of the demultiplexer includes a first inductor having a first terminal and a second terminal, where the first terminal of the first inductor is connected to the second terminal of the band-pass filter and the second terminal of the first inductor is connected to the first terminal of the band-pass filter. The band-pass filter of the demultiplexer further includes a first capacitor having a first terminal and a second terminal, where the first terminal of the first capacitor is connected to the second terminal of the band-pass filter and the second terminal of the first capacitor is connected to the first terminal of the band-pass filter. The band-pass filter of the demultiplexer further includes a second inductor having a first terminal and a second terminal, where the first terminal of the second inductor is connected to the ground reference potential. The band-pass filter of the demultiplexer further includes a second capacitor having a first terminal and a second terminal, where the first terminal of the second capacitor is connected to the first terminal of the band-pass filter and the second terminal of the second capacitor is connected to the second terminal of the second inductor.

In another aspect of the present disclosure, at least one of the first low-pass filter, the band-pass filter, and the second low-pass filter is an active filter.

According to several aspects, a system for receiving radio signals for a vehicle is provided. The system includes an antenna farm unit including a first antenna for receiving amplitude modulated (AM) radio signals and frequency modulated (FM) radio signals and a second antenna configured for receiving satellite radio signals. The antenna farm unit also includes a first amplifier, where the first amplifier has an input port and an output port, and where the input port of the first amplifier is connected to the first antenna. The antenna farm unit also includes a second amplifier, where the second amplifier has an input port and an output port, and where the input port of the second amplifier is connected to the second antenna. The antenna farm unit also includes a first diplexer in electrical communication with the output port of the first amplifier and the output port of the second amplifier. The system also includes a radio unit including an AM/FM tuner, a satellite radio tuner, and a second diplexer in electrical communication with the AM/FM tuner and the satellite radio tuner. The system also includes a transmission line for connecting the antenna farm unit to the radio unit, where the transmission line has a first terminal and a second terminal, and where the first terminal of the transmission line is electrically connected to the first diplexer and the second terminal of the transmission line is electrically connected to the second diplexer. The transmission line is further electrically connected to the first amplifier and the second amplifier, and the first amplifier and the second amplifier each receive a power supply and a DC bias signal from the radio unit using the transmission line.

In another aspect of the present disclosure, the first diplexer and the second diplexer each have a first port, a second port, and a third port. At least one of the first diplexer and the second diplexer includes a first low-pass filter having a first terminal and a second terminal, where the first terminal of the first low-pass filter is connected to the first port. At least one of the first diplexer and the second diplexer further includes a band-pass filter having a first terminal and a second terminal, where the first terminal of the band-pass filter is connected to the second port. At least one of the first diplexer and the second diplexer further includes a second low-pass filter having a first terminal and a second terminal, where the first terminal of the second low-pass filter is connected to the third port. The second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter. The first port of the first diplexer is connected to the output port of the first amplifier, the second port of the first diplexer is connected to the output port of the second amplifier, and the third port of the first diplexer is connected to the first terminal of the transmission line. The first port of the second diplexer is connected to the AM/FM tuner, the second port of the second diplexer is connected to the satellite radio tuner, and the third port of the second diplexer is connected to the second terminal of the transmission line.

In another aspect of the present disclosure, at least one of the first low-pass filter, the band-pass filter, and the second low-pass filter is an active filter.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
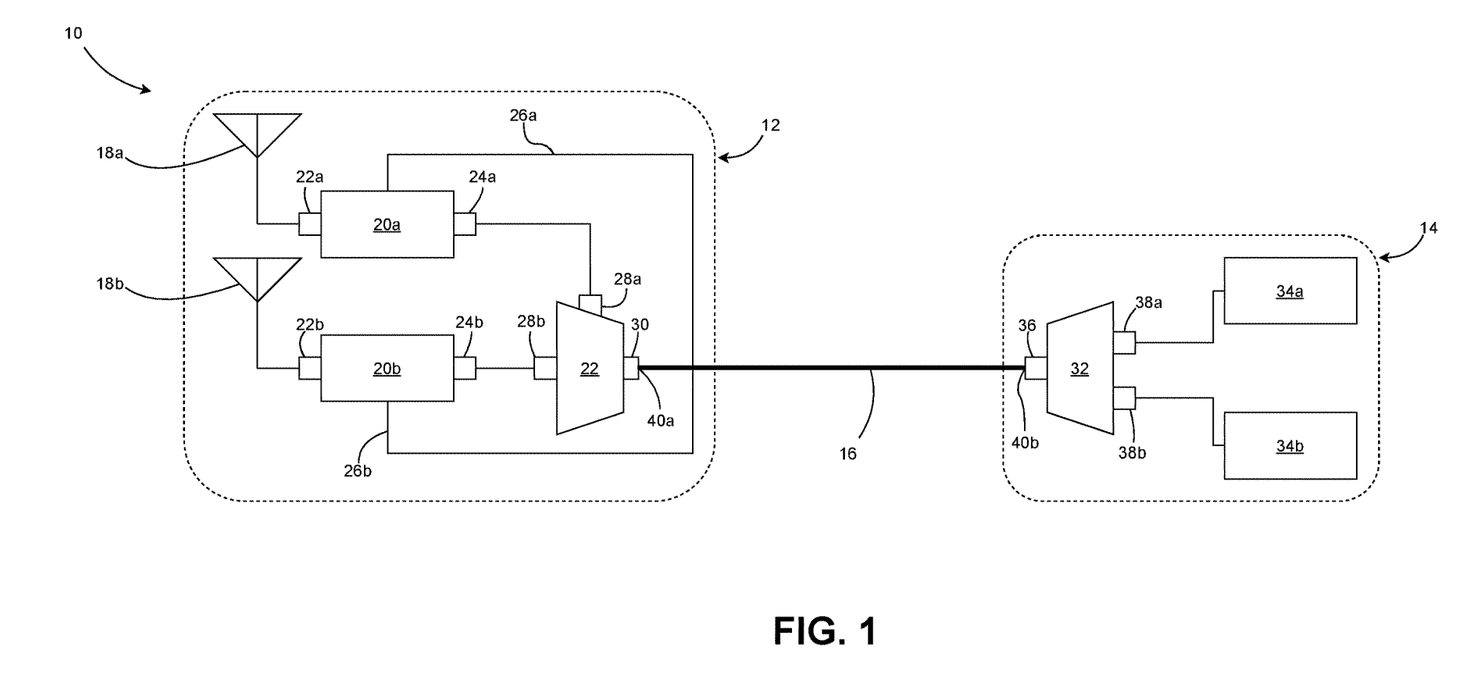
FIG. 1 is a block diagram of a system for receiving radio signals for a vehicle according to an exemplary embodiment.

Referring to FIG. 1, a block diagram of a system for receiving radio signals for a vehicle is illustrated and generally indicated by reference numeral 10. The system 10 generally includes an antenna farm unit 12, a radio unit 14, and a transmission line 16.

The antenna farm unit 12 receives radio signals from the environment and transmits the radio signals to the radio unit 14. The antenna farm unit 12 contains a plurality of antennas 18a, 18b, a plurality of amplifiers 20a, 20b, and a multiplexer 22. The antenna farm unit 12 is in electrical communication with the radio unit 14 using the transmission line 16.

The antennas 18a, 18b receive radio signals from the environment. The antennas 18a, 18b may include various types of antennas, for example, dipole antennas, such as dipole turnstile antennas, dipole corner reflector antennas, and dipole microstrip antennas. The antennas 18a, 18b may also include monopole antennas, such as monopole whip antennas. It should be understood that many additional types of antennas, such as array antennas, loop antennas, and aperture antennas may be used to receive radio signals from the environment without departing from the scope of the present disclosure. The antennas 18a, 18b are electrically connected to the plurality of amplifiers 20a, 20b. The antennas 18a, 18b act as an interface between radio signals propagating through the environment and the system 10 by transforming received radio signals to electrical currents.

In the exemplary embodiment shown in FIG. 1, the first antenna 18a is configured to receive amplitude modulated (AM) and/or frequency modulated (FM) radio signals. For example, AM radio signals may be broadcasted in a bandwidth from 530 KHz to 1710 KHz and FM radio signals may be broadcasted in a bandwidth from 76 MHz to 108 MHz. The second antenna 18b is configured to receive satellite radio signals, for example, SIRIUSXM™ Satellite Radio from Sirius XM Radio Incorporated. SIRIUSXM™ Satellite Radio may be broadcasted in a bandwidth from 2320 MHz to 2345 MHz. It should be understood that the antennas 18a, 18b may be configured to receive various other radio signals The plurality of amplifiers 20a, 20b are used to amplify the electrical currents generated by the antennas 18a, 18b in response to receiving radio signals from the environment. Amplification may be required because the electrical currents corresponding to the desired radio signals may be small relative to electrical currents corresponding to noise and/or undesired radio signals detected by the antennas 18a, 18b. In an exemplary embodiment, the plurality of amplifiers 20a, 20b are low-noise amplifiers (LNA). LNAs are designed to amplify a very low-power signal, such as an electrical current generated by an antenna, without significantly degrading the signal-to-noise ratio of the signal. In a non-limiting example, the amplifiers 20a, 20b also include filters or other electronic circuits designed to remove undesired signal and/or noise from the electrical currents generated by the antennas 18a, 18b. It should be understood that various additional types and/or topologies of amplifiers may be used to amplify the electrical currents generated by the antennas 18a, 18b. Each of the plurality of amplifiers 20a, 20b has an input port 22a, 22b and an output port 24a, 24b. Each of the plurality of antennas 18a, 18b is connected to one of the plurality of amplifiers 20a, 20b using the input ports 22a, 22b. The amplifiers 20a, 20b require a power supply and DC bias signal to function. In an exemplary embodiment, the power supply and DC bias signal is supplied to the amplifiers from the radio unit 14 using the transmission line 16. In another exemplary embodiment, the amplifiers 20a, 20b receive power and DC biasing from a power source (not shown) located in the antenna farm unit 12.

In the exemplary embodiment shown in FIG. 1, the input port 22a of the first amplifier 20a is connected to the first antenna 18a. The input port 22b of the second amplifier 20b is connected to the second antenna 18b. The power and DC biasing is provided by radio unit 14 using the transmission line 16 and the power lines 26a, 26b.

In the present disclosure, the terms multiplexer and diplexer both refer to an electronic device (such as, for example, an integrated circuit, a controller, a field-programmable gate array, or the like) which is configured to perform frequency-division multiplexing (FDM). FDM allows a single transmission medium, such as the transmission line 16, to be shared by multiple independent signals, provided that the multiple independent signals occupy different bandwidths of the frequency domain. The term multiplexer is used to refer to an electronic device configured to perform FDM to combine signals which has n input ports and one output port. A multiplexer may be used to combine n signals for transmission on a single transmission line. The term demultiplexer is used to refer to device which is configured to separate a signal received on a single transmission line into n signals, and thus has one input port and n output ports. The term diplexer is used to refer to a type of multiplexer configured to combine two signals for transmission on a single transmission line and/or separate a signal received on a single transmission line into two signals. Thus, when used to combine two signals for transmission on a single transmission line, a diplexer can be understood to have two input ports and one output port. When used to separate a signal received on a single transmission line into two signals, a diplexer can be understood to have one input port and two output ports.

The multiplexer 22 is used to combine the signals received by the plurality of antennas 18a, 18b and amplified by the plurality of amplifiers 20b such that the combined signal may be transmitted to the radio unit 14 using the transmission line 16. The multiplexer 22 has a plurality of input ports 28a, 28b and an output port 30. Each of the plurality of input ports 28a, 28b is connected to one of the plurality of output ports 24a, 24b of the plurality of amplifiers 20a, 20b. The output port 30 is connected to the transmission line 16.

In the exemplary embodiment shown in FIG. 1, the multiplexer 22 is a first diplexer, because it is configured to combine two signals for transmission on a single transmission line as discussed above. The output port 24a of the first amplifier 20a is connected to the first input port 28a of the multiplexer 22. The output port 24b of the second amplifier 20b is connected to the second input port 28b of the multiplexer 22. Because the second antenna 18b is configured to receive relatively higher frequency signals than the first antenna 18a, the multiplexer 22 is located as close to the second amplifier 20b as possible (i.e., proximate to the second amplifier 20b) in order to mitigate the influence of transmission line effects on the signal from the second amplifier 20b. It should be understood that various types, topologies, and/or designs of the multiplexer 22 may be used to combine the AM/FM signal from the first antenna 18a and the satellite radio signal from the second antenna 18b into one signal for transmission to the radio unit 14 using the transmission line 16. An exemplary embodiment of the multiplexer 22 will be discussed in further detail below in reference to FIGS. 2 and 3.

The radio unit 14 is used to receive a combined signal from the antenna farm unit 12 using the transmission line 16 and separate the combined signal into multiple signals. The radio unit 14 includes a demultiplexer 32 and a plurality of tuners 34a, 34b.

The demultiplexer 32 is used to separate the combined signal transmitted from the antenna farm unit 12 using the transmission line 16 into a plurality of individual signals, each of the plurality of individual signals having been received by one of the plurality of antennas 18a, 18b. The demultiplexer has an input port 36 and a plurality of output ports 38a, 38b. The input port 36 is connected to the transmission line 16. Each of the plurality of output ports 38a, 38b is connected to one of the plurality of tuners 34a, 34b.

In the exemplary embodiment shown in FIG. 1, the demultiplexer 32 is a second diplexer, because it is configured to separate a signal received on a single transmission line into two signals as discussed above. The demultiplexer 32 is further configured to transmit power and DC biasing using the transmission line 16 to the plurality of amplifiers 20a, 20b. It should be understood that various types, topologies, and/or designs of the demultiplexer 32 may be used to separate the combined AM/FM signal from the first antenna 18a and the satellite radio signal from the second antenna 18b into two signals for transmission to the plurality of tuners 34a, 34b. In the exemplary embodiment shown in FIG. 1, the demultiplexer 32 is a diplexer and is identical to the multiplexer 22. It should be understood that the demultiplexer 32 (i.e., second diplexer) in the radio unit 14 may be structurally and/or functionally different from the multiplexer 22 and/or first diplexer in the antenna farm unit 12 without departing from the scope of the present disclosure.

The plurality of tuners 34a, 34b are adjusted by a system, controller (not shown), and/or occupant of the vehicle to select a desired radio signal carrier frequency corresponding to a particular radio station. It should be understood that various types, topologies, and/or designs of tuners 34a, 34b may be used depending on the characteristics of the desired radio signals received by the plurality of antennas 18a, 18b. In the exemplary embodiment shown in FIG. 1, the plurality of tuners 34a, 34b includes an AM/FM tuner 34a and a satellite radio tuner 34b. The AM/FM tuner 34a is connected to the first output port 38a of the demultiplexer 32. The satellite radio tuner 34b is connected to the second output port 38b of the demultiplexer 32. In a non-limiting example, the tuners 34a, 34b are integrated into a human-machine interface (not shown) of the vehicle (e.g., a vehicle radio and/or entertainment system), thus allowing an occupant of the vehicle to select a desired AM, FM, and/or satellite radio station to provide entertainment in the vehicle.

The transmission line 16 is a specialized cable designed to conduct electromagnetic waves in a contained manner. The transmission line 16 is designed to minimize power losses between the antenna farm unit 12 and the radio unit 14. For example, the transmission line 16 may be impedance matched to the antenna farm unit 12 and the radio unit 14 in order to minimize reflections and thus power losses. The transmission line 16 has a first terminal and a second terminal 40b. The first terminal 40a is connected to the output port 30 of the multiplexer 22 in the antenna farm unit 12. The second terminal is connected to the input port 36 of the demultiplexer 32 in the radio unit 14.

Figure 2:
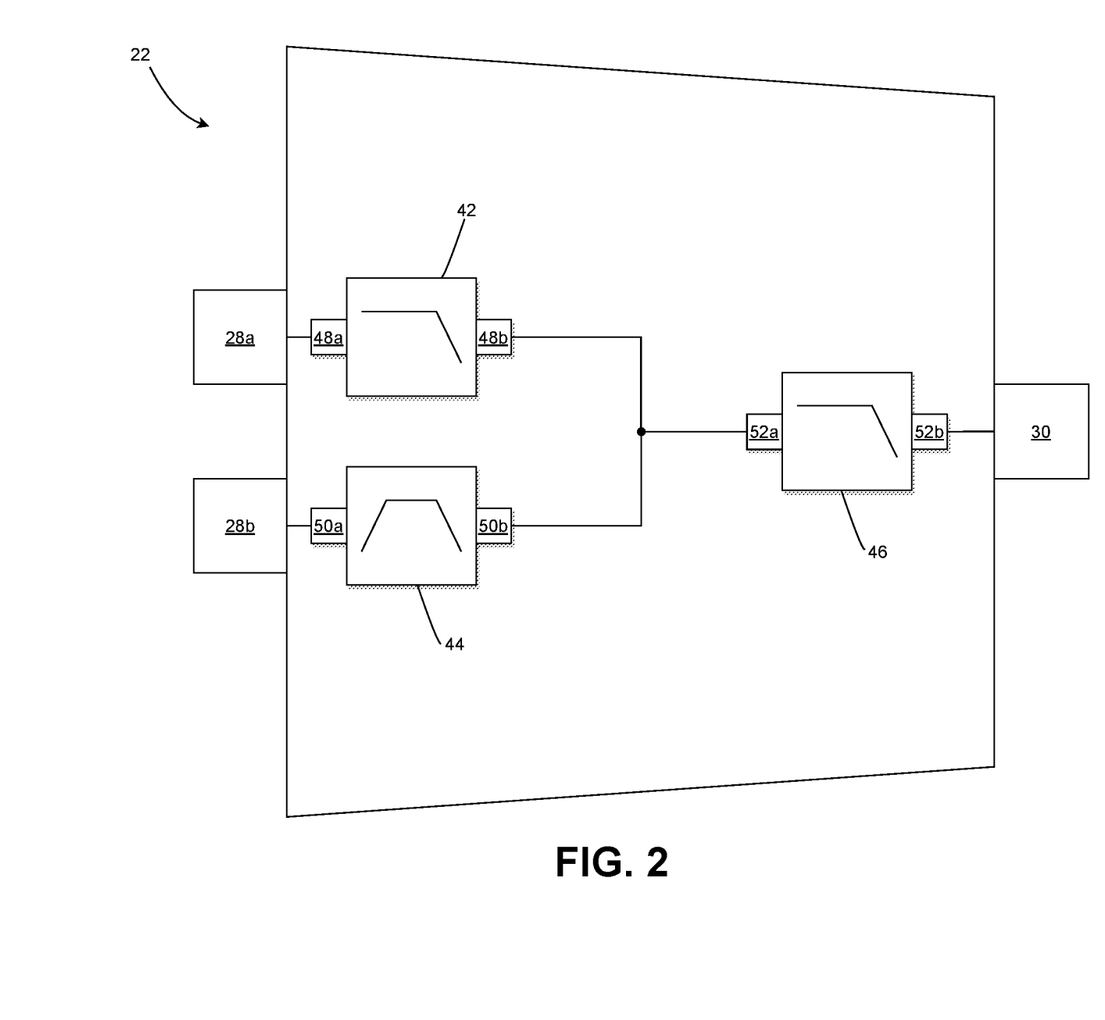
FIG. 2 is a block diagram of an exemplary embodiment of a multiplexer shown according to an exemplary embodiment.

Referring to FIG. 2, a block diagram of an exemplary embodiment of the multiplexer 22 is shown. The multiplexer 22 is a diplexer, because it is configured to combine two signals for transmission on a single transmission line as discussed above. The multiplexer 22 has two input ports 28a, 28b and one output port 30. The multiplexer 22 includes a first low-pass filter 42, a band-pass filter 44, and a second low-pass filter 46. The first low-pass filter has a first terminal 48a and a second terminal 48b. The band-pass filter has a first terminal 50a and a second terminal 50b. The second low-pass filter has a first terminal 52a and a second terminal 52b.

The first terminal 48a of the first low-pass filter 42 is connected to the first input port 28a of the multiplexer 22. The second terminal 48b of the first low-pass filter 42 is connected to the second terminal 50b of the band-pass filter 44 and the first terminal 52a of the second low-pass filter 46. The first terminal 50a of the band-pass filter 44 is connected to the second input port 28b of the multiplexer 22. The second terminal 50b of the band-pass filter 44 is connected to the second terminal 48b of the first low-pass filter 42 and the first terminal 52a of the second low-pass filter 46. The first terminal 52a of the second low-pass filter 46 is connected to the second terminal 48b of the first low-pass filter 42 and the second terminal 50b of the band-pass filter 44. The second terminal 52b of the second low-pass filter 46 is connected to the output port 30 of the multiplexer 22.

The first low-pass filter 42, the band-pass filter 44, and the second low-pass filter 46 may be implemented using various electrical circuits. In an exemplary embodiment, the multiplexer 22 includes active filters, for example, active biquad filters and/or active Sallen-Key filters. It should be understood that various types, topologies, and/or designs of active filters may be used to implement the filters 42, 44, 46 of the multiplexer 22. In another exemplary embodiment, the multiplexer 22 includes passive filters, as will be discussed in greater detail in reference to FIG. 3.

The first low-pass filter 42, the band-pass filter 44, and the second low-pass filter 46 are configured to have cutoff frequencies based on the characteristics of the desired radio signals received by the plurality of antennas 18a, 18b. In an exemplary embodiment, the first low-pass filter 42 and the second low-pass filter 46 has an upper cutoff frequency of about 108 MHz, which may be, for example, the top of the AM/FM radio frequency band. The band-pass filter 44 has a lower cutoff frequency of about 2320 MHz and an upper cutoff frequency of about 2345 MHz, which may, for example, define the frequency band of SIRIUSXM™ Satellite Radio. It should be understood that the filters 42, 44, 46 may be configured with various cutoff frequencies depending on the intended use-case of the system 10.

Figure 3:
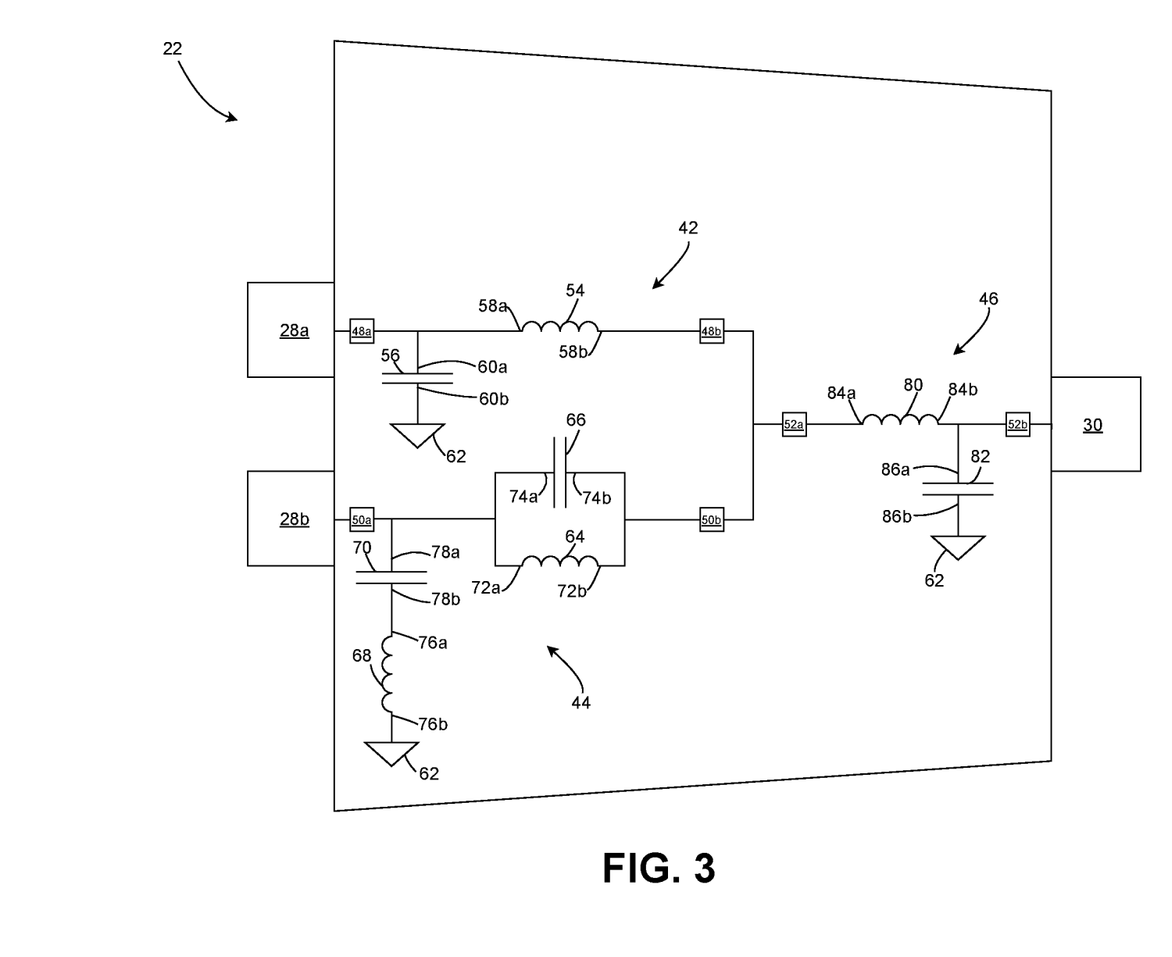
FIG. 3 is a schematic diagram of an exemplary embodiment of the multiplexer including passive filters according to an exemplary embodiment.

Referring to FIG. 3, a schematic diagram of an exemplary embodiment of the multiplexer 22 including passive filters is shown. In the exemplary embodiment shown in FIG. 3, the first low-pass filter 42 of the multiplexer 22 includes an inductor 54 and a capacitor 56. The inductor 54 has a first terminal 58a and a second terminal 58b. The capacitor 56 has a first terminal 60a and a second terminal 60b. The first terminal 58a of the inductor 54 is connected to the first terminal 48a of the first low-pass filter 42 and the first terminal 60a of the capacitor 56. The second terminal 58b of the inductor 54 is connected to the second terminal 48b of the first low-pass filter 42. The first terminal 60a of the capacitor 56 is connected to the first terminal 48a of the first low-pass filter 42 and the first terminal 58a of the inductor 54. The second terminal 60b of the capacitor 56 is the connected to a ground reference potential 62. In a non-limiting example, the ground reference potential 62 is a connection to a negative terminal of a battery of the vehicle.

The band-pass filter 44 includes a first inductor 64, a first capacitor 66, a second inductor 68, and a second capacitor 70. The first inductor 64 has a first terminal 72a and a second terminal 72b. The first capacitor 66 has a first terminal 74a and a second terminal 74b. The second inductor 68 has a first terminal 76a and a second terminal 76b. The second capacitor 70 has a first terminal 78a and a second terminal 78b.

The first terminal 72a of the first inductor 64 is connected to the first terminal 50a of the band-pass filter 44 and the first terminal 74a of the first capacitor 66. The second terminal 72b of the first inductor 64 is connected to the second terminal 50b of the band-pass filter 44 and the second terminal 74b of the first capacitor 66.

The first terminal 74a of the first capacitor 66 is connected to the first terminal 50a of the band-pass filter 44 and the first terminal 72a of the first inductor 64. The second terminal 74b of the first capacitor 66 is connected to the second terminal 50b of the band-pass filter 44 and the second terminal 72b of the first inductor 64.

The first terminal 76a of the second inductor 68 is connected to the second terminal 78b of the second capacitor 70. The second terminal 76b of the second inductor 68 is connected to the ground reference potential 62. The first terminal 78a of the second capacitor 70 is connected to the first terminal 50a of the band-pass filter 44, the first terminal 72a of the first inductor 64, and the first terminal 74a of the first capacitor 66. The second terminal 78b of the second capacitor 70 is connected to the first terminal 76a of the second inductor 68.

The second low-pass filter 46 includes an inductor 80 and a capacitor 82. The inductor 80 has a first terminal 84a and a second terminal 84b. The capacitor 82 has a first terminal 86a and a second terminal 86b. The first terminal 84a of the inductor 80 is connected to the first terminal 52a of the second low-pass filter 46. The second terminal 84b of the inductor 80 is connected to the second terminal 52b of the second low-pass filter 46 and the first terminal 86a of the capacitor 82. The first terminal 86a of the capacitor 82 is connected to the second terminal 52b of the second low-pass filter 46 and the second terminal 84b of the inductor 80. The second terminal 86b of the capacitor 82 is the connected to the ground reference potential 62.

It should be understood that component values (i.e., inductance and capacitance) of each inductor 54, 64, 80 and each capacitor 56, 66, 70, 82 may be chosen to achieve specific cutoff frequencies for each filter 44, 44, 46 according to the intended use-case of the system 10 as discussed above.

It should be understood that the demultiplexer 32 (i.e., second diplexer) may be identical or similar to the exemplary embodiments shown in FIGS. 2 and 3. For example, by using the output port 30 as an input and the input ports 28a, 28b as outputs, the exemplary multiplexer 22 shown in FIGS. 2 and 3 may be used as the demultiplexer 32. The demultiplexer 32 may also be structurally and/or functionally different from the exemplary multiplexer 22 shown in FIGS. 2 and 3 without departing from the scope of the present disclosure.

Figure 4:
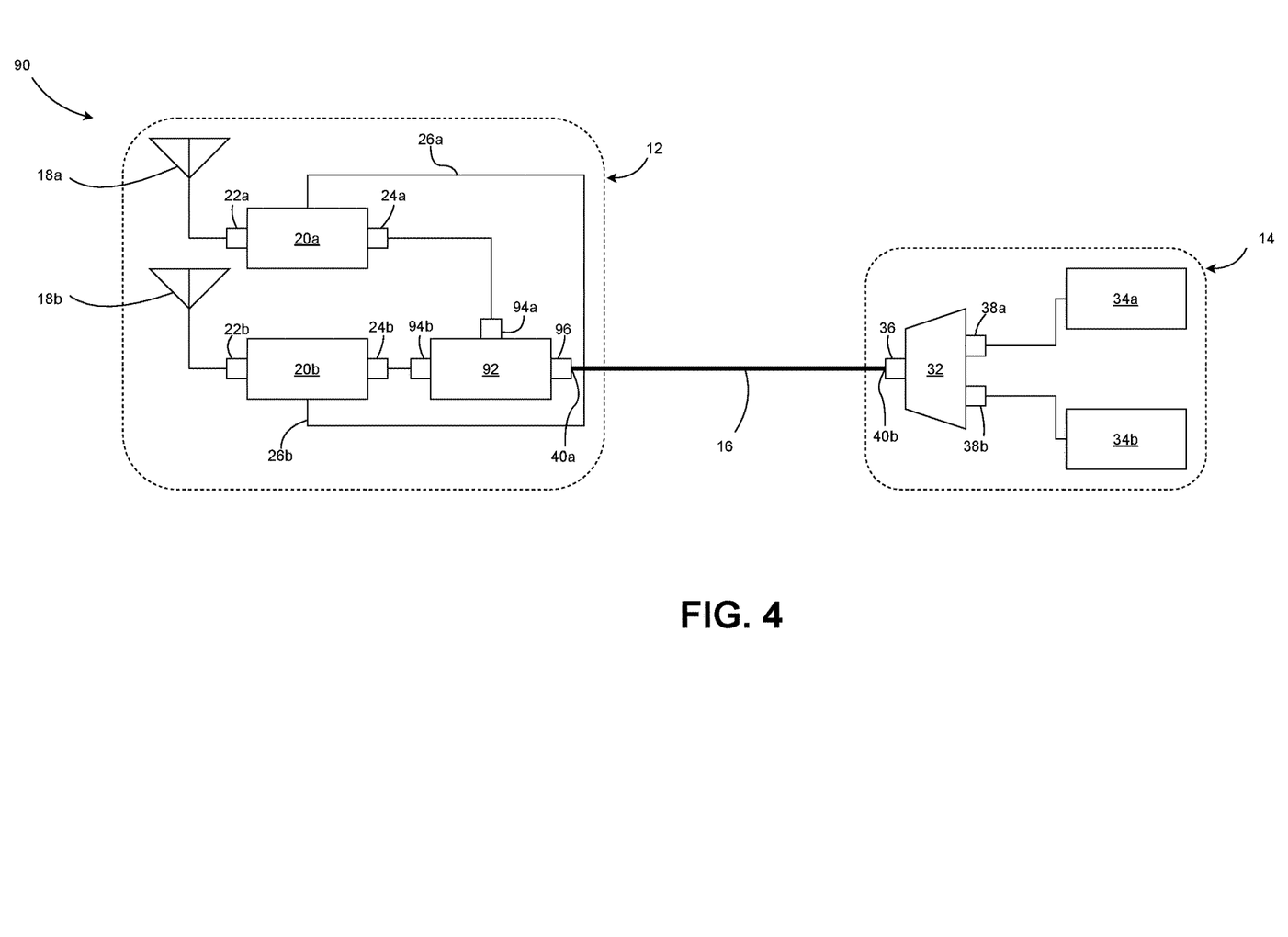
FIG. 4 is a block diagram of an alternate system for receiving radio signals for a vehicle according to an exemplary embodiment.

Referring to FIG. 4, a block diagram of an alternate system for receiving radio signals for a vehicle is illustrated and generally indicated by reference numeral 90. The system 90 is similar to the system 10 shown in FIG. 1 and like components are indicated by like reference numbers. However, the multiplexer 22 of the system 10 is replaced by a radio frequency (RF) switch 92 in the system 90.

The RF switch 92 is used to select one of the plurality of signals from the plurality of amplifiers 20a, 20b to transmit to the radio unit 14 using the transmission line 16. The RF switch 92 has a plurality of input terminals 94a, 94b and an output terminal 96. Each of the plurality of input terminals 94a, 94b is connected to one of the plurality of output ports 24a, 24b of the plurality of amplifiers 20a, 20b. The output terminal 96 is connected to the transmission line 16. The RF switch operates by establishing an electrical connection between one of the plurality of input terminals 94a, 94b and the output terminal 96 based on a control signal.

In the exemplary embodiment shown in FIG. 4, the RF switch 92 is a single pole, double throw (SPDT) RF switch because the RF switch 92 has two input terminals 94a, 94b and one output terminal 96. The first input terminal 94a is connected to the output port 24a of the first amplifier 20a. The second input terminal 94b is connected to the output port 24b of the second amplifier 20b. The output terminal 96 is connected to the first terminal 40a of the transmission line 16. The control signal for the RF switch 92 is transmitted using the transmission line 16. In a non-limiting example, the second terminal 40b of the transmission line 16 is in communication with the tuners 34a, 34b. In a non-limiting example discussed above, the tuners 34a, 34b are integrated into a human-machine interface (not shown) of the vehicle, thus allowing an occupant of the vehicle to select a desired AM, FM, or satellite radio station. Based on the selection of the occupant, the tuners 34a, 34b provide the aforementioned control signal to the RF switch 92 using the transmission line 16. It should be understood that the control signal may be carried by a separate control wire (not shown) from the radio unit 14 to the RF switch 92 without departing from the scope of the present disclosure.

The demultiplexer 32 of the system 90 is used to route the signal from the transmission line 16 to the appropriate tuner 34a, 34b as described above in reference to the system 10. In a non-limiting example, if an AM/FM signal is transmitted from the first antenna 18a, then the demultiplexer 32 functions to route the AM/FM signal from the input port 36 to the first output port 38a and thus to the AM/FM tuner 34a. In another non-limiting example, if a satellite radio signal is transmitted from the second antenna 18b, then the demultiplexer 32 functions to route the satellite radio signal from the input port 36 to the second output port 38b and thus to the satellite radio tuner 34b.

The systems 10, 90 of the present disclosure offers several advantages. For example, the present disclosure provides a system to transmit both an AM/FM radio signal and a satellite radio signal using one transmission line. The use of one transmission line provides a lower cost system having a lower mass, higher reliability, and a more compact design as compared to other systems.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A system for receiving radio signals for a vehicle, the system comprising:
   an antenna farm unit including:
      a plurality of antennas;
      a plurality of amplifiers, wherein each of the plurality of amplifiers has an input port and an output port, and wherein the input port of each of the plurality of amplifiers is in electrical communication with one of the plurality of antennas; and
      a multiplexer in electrical communication with the output port of each of the plurality of amplifiers;
   a radio unit including:
      a plurality of tuners; and
      a demultiplexer in electrical communication with the plurality of tuners; and
   a transmission line for connecting the antenna farm unit to the radio unit, wherein the transmission line has a first terminal and a second terminal, and wherein the first terminal of the transmission line is electrically connected to the multiplexer and the second terminal of the transmission line is electrically connected to the demultiplexer.

2. The system of claim 1, wherein:
   the plurality of antennas of the antenna farm unit includes:
      a first antenna for receiving amplitude modulated (AM) radio signals and frequency modulated (FM) radio signals; and
      a second antenna configured for receiving satellite radio signals; and
   the plurality of amplifiers includes:
      a first amplifier, wherein the input port of the first amplifier is connected to the first antenna; and
      a second amplifier, wherein the input port of the second amplifier is connected to the second antenna; and
   the plurality of tuners of the radio unit includes:
      an AM/FM tuner; and
      a satellite radio tuner.

3. The system of claim 2, wherein the multiplexer and the demultiplexer each have a first port, a second port, and a third port and wherein at least one of the multiplexer and the demultiplexer includes:
   a first low-pass filter having a first terminal and a second terminal, wherein the first terminal of the first low-pass filter is connected to the first port;
   a band-pass filter having a first terminal and a second terminal, wherein the first terminal of the band-pass filter is connected to the second port;
   a second low-pass filter having a first terminal and a second terminal, wherein the first terminal of the second low-pass filter is connected to the third port; and
   wherein the second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter;

wherein the first port of the multiplexer is connected to the output port of the first amplifier, the second port of the multiplexer is connected to the output port of the second amplifier, and the third port of the multiplexer is connected to the first terminal of the transmission line; and wherein the first port of the demultiplexer is connected to the AM/FM tuner, the second port of the demultiplexer is connected to the satellite radio tuner, and the third port of the demultiplexer is connected to the second terminal of the transmission line.

4. The system of claim 3, wherein:
the first low-pass filter of at least one of the multiplexer and the demultiplexer includes:
   an inductor having a first terminal and a second terminal, wherein the first terminal of the inductor is connected to the first terminal of the first low-pass filter and the second terminal of the inductor is connected to the second terminal of the first low-pass filter; and
   a capacitor having a first terminal and a second terminal, wherein the first terminal of the capacitor is connected to the first terminal of the first low-pass filter and the second terminal of the capacitor is connected to a ground reference potential; and
the second low-pass filter of at least one of the multiplexer and the demultiplexer includes:
   an inductor having a first terminal and a second terminal, wherein the first terminal of the inductor is connected to the first terminal of the second low-pass filter and the second terminal of the inductor is connected to the second terminal of the second low-pass filter; and
   a capacitor having a first terminal and a second terminal, wherein the first terminal of the capacitor is connected to the first terminal of the second low-pass filter and the second terminal of the capacitor is connected to the ground reference potential.

5. The system of claim 4, wherein the band-pass filter of at least one of the multiplexer and the demultiplexer includes:
   a first inductor having a first terminal and a second terminal, wherein the first terminal of the first inductor is connected to the first terminal of the band-pass filter and the second terminal of the first inductor is connected to the second terminal of the band-pass filter;
   a first capacitor having a first terminal and a second terminal, wherein the first terminal of the first capacitor is connected to the first terminal of the band-pass filter and the second terminal of the first capacitor is connected to the second terminal of the band-pass filter;
   a second inductor having a first terminal and a second terminal, wherein the second terminal of the second inductor is connected to the ground reference potential; and
   a second capacitor having a first terminal and a second terminal, wherein the first terminal of the second capacitor is connected to the first terminal of the band-pass filter and the second terminal of the second capacitor is connected to the first terminal of the second inductor.

6. The system of claim 3, wherein at least one of the first low-pass filter, the band-pass filter, and the second low-pass filter is an active filter.

7. The system of claim 3, wherein at least one of the first low-pass filter and the second low-pass filter has an upper cutoff frequency of about 108 MHz.

8. The system of claim 3, wherein the band-pass filter has a lower cutoff frequency of about 2320 MHz and an upper cutoff frequency of about 2345 MHz.

9. The system of claim 2, wherein the multiplexer is located proximate to the second amplifier and the second antenna.

10. The system of claim 1, wherein the first terminal of the transmission line is further connected to the plurality of amplifiers, and wherein the plurality of amplifiers each receive a power supply and a DC bias signal from the radio unit using the transmission line.

11. A system for receiving radio signals for a vehicle, the system comprising:
   an antenna farm unit including:
      a plurality of antennas;
      a plurality of amplifiers, wherein each of the plurality of amplifiers has an input port and an output port, and wherein the input port of each of the plurality of amplifiers is in electrical communication with one of the plurality of antennas; and
      a radio frequency (RF) switch in electrical communication with the output port of each of the plurality of amplifiers;
   a radio unit including:
      a plurality of tuners; and
      a demultiplexer in electrical communication with the plurality of tuners; and
   a transmission line for connecting the antenna farm unit to the radio unit, wherein the transmission line has a first terminal and a second terminal, and wherein the first terminal of the transmission line is electrically connected to the RF switch and the second terminal of the transmission line is electrically connected to the demultiplexer.

12. The system of claim 11, wherein:
the plurality of antennas of the antenna farm unit includes:
   a first antenna for receiving amplitude modulated (AM) radio signals and frequency modulated (FM) radio signals; and
   a second antenna configured for receiving satellite radio signals;
the plurality of amplifiers includes:
   a first amplifier, wherein the input port of the first amplifier is connected to the first antenna and the first amplifier receives power and DC bias from the radio unit using the transmission line; and
   a second amplifier, wherein the input port of the second amplifier is connected to the second antenna and the second amplifier receives power and DC bias from the radio unit using the transmission line; and
the plurality of tuners of the radio unit includes:
   an AM/FM tuner; and
   a satellite radio tuner.

13. The system of claim 12, wherein the RF switch is a single pole, double throw (SPDT) RF switch having:
   a first terminal connected to the output port of the first amplifier;
   a second terminal connected to the output port of the second amplifier;
   a third terminal connected to the first terminal of the transmission line; and
   wherein the SPDT RF switch is configured to be operated by a control signal received at the third terminal of the SPDT RF switch from the transmission line.

14. The system of claim 12, wherein the demultiplexer has a first port, a second port, and a third port and wherein the demultiplexer includes:
- a first low-pass filter having a first terminal and a second terminal, wherein the first terminal of the first low-pass filter is connected to the first port;
- a band-pass filter having a first terminal and a second terminal, wherein the first terminal of the band-pass filter is connected to the second port;
- a second low-pass filter having a first terminal and a second terminal, wherein the first terminal of the second low-pass filter is connected to the third port;
- wherein the second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter; and
- wherein the first port of the demultiplexer is connected to the AM/FM tuner, the second port of the demultiplexer is connected to the satellite radio tuner, and the third port of the demultiplexer is connected to the second terminal of the transmission line.

15. The system of claim 14, wherein:
the first low-pass filter of the demultiplexer includes:
- an inductor having a first terminal and a second terminal, wherein the first terminal of the inductor is connected to the first terminal of the first low-pass filter and the second terminal of the inductor is connected to the second terminal of the first low-pass filter; and
- a capacitor having a first terminal and a second terminal, wherein the first terminal of the capacitor is connected to the first terminal of the first low-pass filter and the second terminal of the capacitor is connected to a ground reference potential; and the second low-pass filter of the demultiplexer includes:
- an inductor having a first terminal and a second terminal, wherein the first terminal of the inductor is connected to the first terminal of the second low-pass filter and the second terminal of the inductor is connected to the second terminal of the second low-pass filter; and
- a capacitor having a first terminal and a second terminal, wherein the first terminal of the capacitor is connected to the first terminal of the second low-pass filter and the second terminal of the capacitor is connected to the ground reference potential.

16. The system of claim 15, wherein the band-pass filter of the demultiplexer includes:
- a first inductor having a first terminal and a second terminal, wherein the first terminal of the first inductor is connected to the second terminal of the band-pass filter and the second terminal of the first inductor is connected to the first terminal of the band-pass filter;
- a first capacitor having a first terminal and a second terminal, wherein the first terminal of the first capacitor is connected to the second terminal of the band-pass filter and the second terminal of the first capacitor is connected to the first terminal of the band-pass filter;
- a second inductor having a first terminal and a second terminal, wherein the first terminal of the second inductor is connected to the ground reference potential; and
- a second capacitor having a first terminal and a second terminal, wherein the first terminal of the second capacitor is connected to the first terminal of the band-pass filter and the second terminal of the second capacitor is connected to the second terminal of the second inductor.

17. The system of claim 14, wherein at least one of the first low-pass filter, the band-pass filter, and the second low-pass filter is an active filter.

18. A system for receiving radio signals for a vehicle, the system comprising:
an antenna farm unit including:
- a first antenna for receiving amplitude modulated (AM) radio signals and frequency modulated (FM) radio signals; and
- a second antenna configured for receiving satellite radio signals;
- a first amplifier, wherein the first amplifier has an input port and an output port, and wherein the input port of the first amplifier is connected to the first antenna;
- a second amplifier, wherein the second amplifier has an input port and an output port, and wherein the input port of the second amplifier is connected to the second antenna; and
- a first diplexer in electrical communication with the output port of the first amplifier and the output port of the second amplifier;

a radio unit including:
- an AM/FM tuner;
- a satellite radio tuner; and
- a second diplexer in electrical communication with the AM/FM tuner and the satellite radio tuner; and a transmission line for connecting the antenna farm unit to the radio unit, wherein the transmission line has a first terminal and a second terminal, and wherein the first terminal of the transmission line is electrically connected to the first diplexer and the second terminal of the transmission line is electrically connected to the second diplexer, and wherein the transmission line is further electrically connected to the first amplifier and the second amplifier, and the first amplifier and the second amplifier each receive a power supply and a DC bias signal from the radio unit using the transmission line.

19. The system of claim 18, wherein the first diplexer and the second diplexer each have a first port, a second port, and a third port and wherein at least one of the first diplexer and the second diplexer includes:
- a first low-pass filter having a first terminal and a second terminal, wherein the first terminal of the first low-pass filter is connected to the first port;
- a band-pass filter having a first terminal and a second terminal, wherein the first terminal of the band-pass filter is connected to the second port;
- a second low-pass filter having a first terminal and a second terminal, wherein the first terminal of the second low-pass filter is connected to the third port;
- wherein the second terminal of the first low-pass filter is connected to the second terminal of the band-pass filter and the second terminal of the second low-pass filter, the second terminal of the band-pass filter is connected to the second terminal of the first low-pass filter and the second terminal of the second low-pass filter, and the second terminal of the second low-pass filter is connected to the second terminal of the first low-pass filter and the second terminal of the band-pass filter;

wherein the first port of the first diplexer is connected to the output port of the first amplifier, the second port of the first diplexer is connected to the output port of the second amplifier, and the third port of the first diplexer is connected to the first terminal of the transmission line; and wherein the first port of the second diplexer is connected to the AM/FM tuner, the second port of the second diplexer is connected to the satellite radio tuner, and the third port of the second diplexer is connected to the second terminal of the transmission line.

20. The system of claim 19, wherein at least one of the first low-pass filter, the band-pass filter, and the second low-pass filter is an active filter.

\* \* \* \* \*